(12) United States Patent
Yakushiji et al.

(10) Patent No.: US 12,142,489 B2
(45) Date of Patent: Nov. 12, 2024

(54) SEMICONDUCTOR DEVICE MANUFACTURING METHOD AND PLASMA PROCESSING METHOD

(71) Applicant: Hitachi High-Tech Corporation, Tokyo (JP)

(72) Inventors: Mamoru Yakushiji, Tokyo (JP); Kenichi Kuwahara, Tokyo (JP); Makoto Miura, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 17/642,312

(22) PCT Filed: Mar. 4, 2021

(86) PCT No.: PCT/JP2021/008520
§ 371 (c)(1),
(2) Date: Mar. 11, 2022

(87) PCT Pub. No.: WO2022/185491
PCT Pub. Date: Sep. 9, 2022

(65) Prior Publication Data
US 2023/0411167 A1  Dec. 21, 2023

(51) Int. Cl.
*H01L 21/3213* (2006.01)
*H01L 21/8234* (2006.01)
(Continued)

(52) U.S. Cl.
CPC .............. *H01L 21/32136* (2013.01); *H01L 21/823412* (2013.01); *H01L 29/0673* (2013.01); *H01L 29/42392* (2013.01); *H01L 29/66439* (2013.01); *H01L 27/088* (2013.01); *H01L 29/775* (2013.01); *H01L 29/78696* (2013.01)

(58) Field of Classification Search
None
See application file for complete search history.

(56) References Cited

U.S. PATENT DOCUMENTS

2010/0176454 A1* 7/2010 Hooker ........... H01L 21/823842
257/369
2012/0094495 A1 4/2012 Honda et al.
(Continued)

FOREIGN PATENT DOCUMENTS

JP 2010-041028 A 2/2010
KR 10-2020-110598 A 9/2020

OTHER PUBLICATIONS

Search Report mailed Jun. 8, 2021 in International Application No. PCT/JP2021/008520.
(Continued)

*Primary Examiner* — Shamim Ahmed
(74) *Attorney, Agent, or Firm* — Miles & Stockbridge, P.C.

(57) ABSTRACT

A semiconductor device manufacturing method for manufacturing a semiconductor device including Gate All Around type Field effect transistors includes a step of removing an organic film on an n-type channel; a step of removing a work function control metal film on a bottom surface between channels; a step of forming a protective film onto an organic film on a p-type channel; and a step of removing a work function control metal film on the n-type channel.

14 Claims, 7 Drawing Sheets

(51) Int. Cl.
  *H01L 29/06* (2006.01)
  *H01L 29/423* (2006.01)
  *H01L 29/66* (2006.01)
  H01L 27/088 (2006.01)
  H01L 29/775 (2006.01)
  H01L 29/786 (2006.01)

(56) References Cited

U.S. PATENT DOCUMENTS

| | | |
|---|---|---|
| 2018/0308766 A1 | 10/2018 | Mochizuki et al. |
| 2018/0308768 A1 | 10/2018 | Mochizuki et al. |
| 2019/0378906 A1 | 12/2019 | Loubet et al. |
| 2020/0006356 A1 | 1/2020 | Ando et al. |
| 2020/0051872 A1 | 2/2020 | Guo et al. |
| 2022/0285165 A1 | 9/2022 | Chen et al. |

OTHER PUBLICATIONS

Written Opinion mailed Jun. 8, 2021 in International Application No. PCT/JP2021/008520.
Office Action mailed Jan. 16, 2024 in Korean Application No. 10-2022-7003175.

* cited by examiner

FIG. 5

| | |
|---|---|
| $SF_6$ GAS | 100 sccm |
| GAS PRESSURE | 1.0 Pa |
| POWER OF MICROWAVE POWER SUPPLY | 600 W |
| POWER OF RADIO FREQUENCY BIAS POWER SUPPLY | 0 W |
| PROCESSING TIME | 5 sec |

FIG. 6

| | |
|---|---|
| $N_2$ GAS | 60 sccm |
| Ar GAS | 288 sccm |
| $CH_4$ GAS | 12 sccm |
| GAS PRESSURE | 3.5 Pa |
| POWER OF MICROWAVE POWER SUPPLY | 1000 W |
| POWER OF RADIO FREQUENCY BIAS POWER SUPPLY | 0 W |
| PROCESSING TIME | 10 sec |

FIG. 7

ELEMENT RATIO IN SURFACE OF BARC (%) 71

| ELEMENT | C | F | O | Si | S | N |
|---|---|---|---|---|---|---|
| BEFORE SURFACE MODIFICATION PROCESS | 87.4 | 0.9 | 10.2 | 0.8 | 0.0 | 0.7 |
| AFTER SURFACE MODIFICATION PROCESS | 61.8 | 30.7 | 6.1 | 0.3 | 1.1 | 0.0 |

ELEMENT RATIO IN SURFACE OF HfO (%) 72

| ELEMENT | Hf | O | F | C | Ti | Si |
|---|---|---|---|---|---|---|
| BEFORE SURFACE MODIFICATION PROCESS | 22.4 | 54.1 | 2.4 | 20.0 | 0.0 | 1.1 |
| AFTER SURFACE MODIFICATION PROCESS | 21.0 | 39.7 | 22.0 | 15.6 | 1.0 | 0.6 |

ELEMENT RATIO IN SURFACE OF TiN (%) 73

| ELEMENT | Ti | N | O | C | F | Si |
|---|---|---|---|---|---|---|
| BEFORE SURFACE MODIFICATION PROCESS | 24.8 | 23.4 | 30.2 | 19.8 | 0.6 | 1.1 |
| AFTER SURFACE MODIFICATION PROCESS | 24.1 | 23.1 | 23.2 | 21.1 | 7.9 | 0.6 |

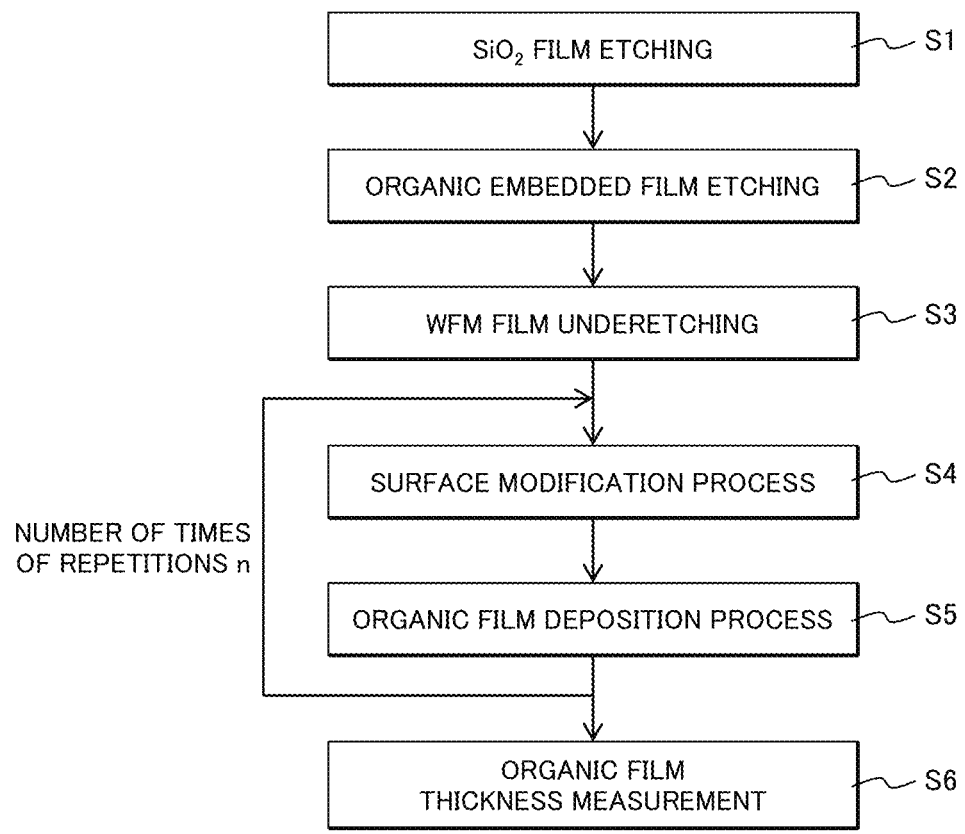

SEMICONDUCTOR DEVICE MANUFACTURING METHOD AND PLASMA PROCESSING METHOD

TECHNICAL FIELD

The present invention relates to a semiconductor device manufacturing method and a plasma processing method.

BACKGROUND ART

In order to improve the functionality and performance of integrated circuit chips continuously, size shrinkage of transistors is indispensable. According to IRDS (International Roadmap for Devices and Systems) of 2020 edition, an index of pattern size shrinkage called a technology node is now a 5-nm node and is anticipated to be a 3-nm node in 2024 and, further, a 1-nm node in 2033. A total size of the width and spacing of a semiconductor line in real wiring is called a pitch and its half is called a half pitch (HP: Half Pitch). It is commonly recognized that HP is 15 nm for a 5-nm technology node, 12 nm for a 3-nm node, and 8 nm for a 1-nm node. In addition, various considerations are made about device structure and material to aim at transistor size shrinkage and improvement in transistor performance.

For example, the following can be mentioned: introduction of distortion in source/drain regions in a metal oxide film semiconductor field effect transistor (MOSFET: Metal Oxide Semiconductor Field Effect Transistor), introduction of a high electric gate insulating film and a metal, introduction of a new structure like a Fin type that supersedes a Planer type, etc. A Fin type FET improves gate controllability by covering the surroundings of a Fin type channel having a three-dimensional structure with a gate and enables it to restrain a short channel effect (i.e., an increase in leakage current) due to shortened gate length resulting from transistor size shrinkage.

Recent progress of further size shrinkage turns the form of a channel into a wire-shaped or sheet-shaped laminate and a change is being made to a gate all around (GAA: Gate All Around) type FET in which the surroundings of the channel is covered with a gate. A GAA type FET further improves gate controllability by covering all peripheries of a wire-shaped or sheet-shaped channel (a nanowire channel/ nanosheet channel) with a gate and enables it to more restrain the short channel effect, as compared with the Fin-type FET. In either case of the Fin type FET and the GAA type FET, the following layers are laminated over a channel of the FET: a gate insulating film, a work function control metal film (WFM: Work Function Metal, hereinafter referred to as a WFM film simply), a low resistance gate metal film (HK; High-k, hereinafter referred to as an HK film simply).

Among these films, the WFM film requires the use of a suitable metal material to determine a threshold voltage making the FET get into an operating state, according to the type and usage of the FET. For this reason, a step of exchanging the WFM film with another one according to the FET type is needed in a FET manufacturing process and this complicates the manufacturing process and becomes a constraint for transistor size shrinkage. For example, in order to separately manufacture an n-channel FET and a p-channel FET that are very narrow pitch in geometry, after removing only the WFM film from one FET, it is required to form a suitable metal film in a portion where the removal was made. To realize this, the number of steps should increase and various problems are posed; it was hard to realize it.

PTL 1 discloses a method for manufacturing an n-channel FET and a p-channel FET in a GAA-type FET manufacturing process.

CITATION LIST

Patent Literature

PTL 1: U.S. Unexamined Patent Application Publication No. 2018/0308768

SUMMARY OF INVENTION

Technical Problem

With more progress in shrinking pattern size of wiring, gate dimensions are also becoming very narrow pitch in geometry. In order to separately manufacture an re-channel FET and a p-channel FET of GAA type FETs that are narrow pitch in geometry, it is required to remove only the WFM film from one FET and, then, form a suitable metal film in a portion where the removal was made. To realize this, manufacturing steps, such as film formation, etching, and mask patterning, need to be repeated multiple times and this posed a problem in which the number of steps becomes enormous. Among these steps, there is a problem particularly in the mask patterning step; it is required to perform mask patterning multiple times in a non-etched portion. With recent pitch narrowing, an alignment precision for mask patterning on the order of several nanometers or below has become necessary and the alignment precision for mask patterning was almost reaching the limit.

According to a technique of PTL 1, a method is disclosed as below: the WFM film should be formed according to the channel FET type in the GAA-type FET manufacturing process and, therefore, namely, the WFM film should not be removed in a channel region of one type, whereas the WFM film should be removed from a channel region of the other type to manufacture the n-channel and p-channel FETs. According to this, it is so described that it is enabled to form a suitable WFM film in a portion where the WFM film was removed in the channel region of one type and that it is possible to simplify the manufacturing process and, furthermore, repress increase in the number of steps. Particularly, according to the method of PTL 1, it is not required to repeat mask patterning multiple times and the alignment for mask patterning, which was made very difficult by pitch narrowing, becomes unnecessary. FIG. 1 depicts a first method of PTL 1. In FIG. 1, Rn denotes an n-channel FET formation region and Rp denotes a p-channel FET formation region. FIG. 1(A) depicts an etching step of a hard mask film 102, FIG. 1(B) depicts an etching step of an organic embedded film 103, FIG. 1(C) depicts an underetching step of a WFM film 104 in the n-channel FET formation region Rn, and FIG. 1(D1) and (D2) depict a reflow step of the organic embedded film 103.

A cross-sectional structure of a semiconductor device as a sample depicted in FIG. 1(A) is now briefly described. The cross-sectional structure of the semiconductor device is the structure of a gate part of a gate all around (GAA: Gate All Around) type FET; in this part, multiple sheet-shaped channel layers 106 are layered into a laminate and all the peripheries of the channel layers 106 are covered with gate electrodes 105 via an interposed gate insulating film (not depicted). In this figure, the GAA-type FET source region and drain region are not depicted.

The n-channel FET formation region Rn where an n-channel FET is formed and the p-channel FET formation region Rp where a p-channel FET is formed are provided on the surface side of a semiconductor substrate (Si substrate) 107 made of silicon. Over an insulating film like a silicon oxide film formed on the surface side of the semiconductor substrate 107, a WFM film (work function control metal film) 104 is formed. The semiconductor substrate 107 can also be regarded as a semiconductor wafer.

In the n-channel FET formation region Rn, three silicon films (Si films) 106 that configure the channel layers (a channel region) of the n-channel FET are vertically disposed and all the peripheries of each of the three silicon films 106 are covered with HK films (low resistance gate metal films) 105. Moreover, the respective HK films 105 covering all the peripheries of the three silicon films 106 are covered with WFM films 104. A gate insulting film (not depicted) is interposed between each silicon film (Si film) 106 and each HK film 105.

In the p-channel FET formation region Rp, three silicon films 106 that configure the channel layers (a channel region) of the p-channel FET are vertically disposed and all the peripheries of each of the three silicon films 106 are covered with HK films 105, as with the n-channel FET formation region Rn. Moreover, all the peripheries of the respective HK film 105 covering all the peripheries of the three silicon films 106 are covered with WFM films 104. A gate insulting film (not depicted) is interposed between each silicon film (Si film) 106 and each HK film 105.

In the n-channel FET formation region Rn and the p-channel FET formation region Rp, an organic embedded film 103 is formed to cover the top and side surfaces of the WFM films 104. A hard mask film 102 is formed selectively to cover the top surface of the organic embedded film 103 in the p-channel FET formation region Rp and a resist mask film 102 is formed selectively to cover the top of the hard mask film 102.

According to the first method of PTL 1 (processing progresses in an arrow direction marked in FIG. 1, (A)→(B)→(C)), etching is first performed of the hard mask film 102 of SiO₂ or the like along the resist mask film 101, as depicted in FIG. 1(A). Subsequently, using the hard mask film 102 as an etching mask, etching is performed of the organic embedded film 103 consisting of an organic matter, such as an organic planarizing film (OPL: Organic Planarizing Layer) or a polymethyl methacrylate film (PMMA: Polymethyl methacrylate) in the n-channel FET formation region Rn, as depicted in FIG. 1(B). Subsequently, etching (underetching) is performed of a certain amount of each exposed layer of the WFM film 104 in the n-channel FET formation region Rn and the WFM film 104 on the bottom of the n-channel FET formation region Rn and the p-channel FET formation region Rp is removed, as depicted in FIG. 1(C). Thereby, the WFM film 104 is separated into parts across the boundary between the p-channel FET formation region Rp and the n-channel FET formation region Rn and, at the same time, a recessed space 111 is formed at the bottom of the organic embedded film 103 in the p-channel FET formation region Rp.

Although not depicted, the processing followed by FIG. 1(C) slightly dissolves the organic embedded film 103 in the p-channel FET formation region Rp by applying a heat treatment (reflow treatment) to the organic embedded film 103 in the p-channel FET formation region Rp at a temperature that is somewhat lower than the film's glass transition temperature, thus covering and burying the recessed space 111 formed at the bottom of the organic embedded film 103 in the same region Rp. Thereby, the WFM film 104 and HK films 105 in the p-channel FET formation region Rp are completely protected with the organic embedded film 103. Then, only the WFM films 104 in the re-channel FET formation region Rn are removed by etching and suitable WFM films 104 are formed in portions where the removal was made. It is so described that the n-channel FET and the p-channel FET can be formed in this way.

However, according to the first method of PTL 1, it was very difficult to control the temperature for slightly dissolving the organic embedded film 103 in the p-channel FET formation region. With keeping the temperature of the organic embedded film 103 in the p-channel FET formation region Rp somewhat lower than the film's glass transition temperature, the method covers and buries only the recessed space 111 formed at the bottom of the organic embedded film 103 in the same region Rp. It was very difficult to control the film temperature to remain somewhat lower than the glass transition temperature uniformly throughout the wafer surface. For instance, in the reflow step of the organic embedded film 103, if the film temperature cannot be controlled to remain somewhat lower than the glass transition temperature and the heat treatment was performed at even lower temperature, dissolution of the organic embedded film 103 does not take place and it is impossible to cover and bury the recessed space 111 formed at the bottom of the organic embedded film 103 in the p-channel FET formation region Rp, as depicted in FIG. 1(D1). Conversely, in the reflow step of the organic embedded film 103, if the heat treatment was performed at a temperature that is equal to or higher than the glass transition temperature, dissolution of the organic embedded film 103 is enhanced and it may happen that the organic embedded film 103 will flow and move so that the dissolved organic embedded film 103 will cover even a portion of the n-channel FET formation region Rn that should not be covered. Furthermore, as the enhanced dissolution causes the organic embedded film 103 in the p-channel FET formation region Rp to flow and move, there arises a missing part 112 of the organic embedded film and this film becomes unable to fulfill its inherent role. As noted above, according to the first method of PTL 1, the temperature tolerance range is very narrow and a problem existed in that even quite a little difference in temperature makes it impossible to produce a required effect.

FIG. 2 depicts a second method of PTL 1. In FIG. 2, Rn denotes an n-channel FET formation region and Rp denotes a p-channel FET formation region. FIG. 2(A) denotes an etching step of the hard mask film 102, FIG. 2(B) depicts an etching step of the organic embedded film 103, FIG. 2(C) denotes an underetching step of the WFM film 104 in the n-channel FET formation region Rn, FIG. 2(E) denotes a deposition step of a film 212, and FIG. 2(F) denotes an etching step of the film 212.

According to the second method of PTL 1 (processing progresses in an arrow direction marked in FIG. 2, (A)→(B)→(C)→(E)→(F)), etching is first performed of the hard mask film 102 of SiO₂ or the like along the resist mask film 101, as depicted in FIG. 2(A). Subsequently, etching is performed of the organic embedded film 103 consisting of an organic matter in the n-channel FET formation region Rn, as depicted in FIG. 2(B). Subsequently, etching (underetching) is performed of a certain amount of each exposed layer of the WFM film 104 in the n-channel FET formation region Rn and the WFM film 104 on the bottom of the n-channel FET formation region Rn and the p-channel FET formation region Rp is removed, as depicted in FIG. 2(C). Thereby, the WFM film 104 is separated into parts across the boundary between the p-channel FET formation region Rp and the n-channel FET formation region Rn and, at the same time, a recessed space 111 is formed at the bottom of the organic embedded film 103 in the p-channel FET formation region Rp (the processing up to this point is the same as the first method).

Then, an $SiO_2$ film or an oxide film other than the $SiO_2$ film (hereinafter referred to as the $SiO_2$ film representatively) 212 is deposited to a certain amount of thickness over all surfaces in the p-channel FET formation region Rp and the n-channel FET formation region Rn by an atomic layer deposition method (ALD: Atomic Layer Deposition), as depicted in FIG. 2(E). A range of this deposition according to the principle of ALD is as follows: one atomic layer is deposited on each of the surfaces of the following: the organic embedded film 103 in the p-channel FET formation region Rp, the recessed space 111 formed at the bottom of the organic embedded film 103 in the p-channel FET formation region Rp, and the WFM film 104 and the HK film 105 in the n-channel FET formation region Rn. The deposited film thickness is to be the same for all of them.

Then, the $SiO_2$ film 212 deposited by ALD is removed by etching, as depicted in FIG. 2(F). In this process, only the $SiO_2$ film 212 formed in the abovementioned recessed space 111 formed at the bottom of the organic embedded film 103 in the p-channel FET formation region Rp is not etched or etched at a slowed down speed selectively to leave this $SiO_2$ film without removing it. Thereby, the WFM film 104 and HK films 105 in the p-channel FET formation region Rp are completely protected with the organic embedded film 103 and the $SiO_2$ film 212 deposited by ALD. Then, only the WFM films 104 in the n-channel FET formation region Rn are removed by etching and suitable WFM films 104 are formed in portions where the removal was made. It is so described that the n-channel FET and the p-channel FET can be formed in this way.

However, according to the second method of PTL 1, it was very difficult that only the $SiO_2$ film 212 formed in the abovementioned recessed space 111 formed at the bottom of the organic embedded film 103 in the p-channel FET formation region Rp is not etched or etched at a slowed down speed selectively. Supposing that the size of the recessed space 111 formed at the bottom of the organic embedded film 103 in the p-channel FET formation region Rp is very smaller than other portions, its etching speed may become slower than in other portions by a so-called micro loading effect in which etchants that make etching progress become hard to enter this space. According to the formation process of the recessed space 111 that is formed at the bottom of the organic embedded film 103 in the p-channel FET formation region Rp, a recessed space of the same size is also to be formed, at least, at the bottom of the n-channel FET formation region Rn. In other words, the recessed space 111 that is formed at the bottom of the organic embedded film 103 in the p-channel FET formation region Rp and the recessed space that is formed at the bottom of the n-channel FET formation region Rn are of the same size and the deposited film is to be formed by the ALD in both the spaces of the same size.

In other words, it is difficult that only the $SiO_2$ film 212 formed in the abovementioned recessed space 111 formed at the bottom of the organic embedded film 103 in the p-channel FET formation region Rp is not etched or etched at a slowed down speed selectively to leave this $SiO_2$ film without removing it. That is why, when only the $SiO_2$ film 212 formed in the abovementioned recessed space 111 formed at the bottom of the organic embedded film 103 in the p-channel FET formation region Rp is not etched or etched at a slowed down speed selectively to leave this $SiO_2$ film without removing it, it always follows that the $SiO_2$ film in the recessed space formed at the bottom of the n-channel FET formation region Rn cannot be removed and remains as well.

As noted above, according to the second method of PTL 1, a problem existed in that, in the process of etching that follows forming the deposited film (212) by ALD, it is impossible to leave only the $SiO_2$ film 212 deposited by ALD in the recessed space 111 formed at the bottom of the organic embedded film 103 in the p-channel FET formation region Rp.

A problem of the present invention, devised in view of the above-noted problems, resides in providing a plasma processing method that enables it to deposit a protective film (organic film) selectively onto the surface of an insulating film (an organic embedded film) among metal films (WFM and HK films) and the insulating film (organic embedded film) created on a substrate.

Solution to Problem

A typical instance of the present invention is outlined and summarized as follow.

Specifically, a semiconductor device manufacturing method pertaining to a typical aspect of the present invention is a semiconductor device manufacturing method for manufacturing a semiconductor device including Gate All Around type Field effect transistors, the method including a step of removing an organic film on an n-type channel; a step of removing a work function control metal film on a bottom surface between channels; a step of forming a protective film onto an organic film on a p-type channel; and a step of removing a work function control metal film on the n-type channel.

Advantageous Effects of Invention

According to the semiconductor device manufacturing method of the present invention, it is possible to deposit a protective film selectively onto only an organic film on a p-type channel. Therefore, it is possible to completely protect a work function control metal film in a p-type channel FET formation region with the protective film. Subsequently, only a work function control metal film on an n-type channel can be removed by etching.

Problems, configurations, and advantageous effects other than described above will be made apparent from the following description of embodiments.

BRIEF DESCRIPTION OF DRAWINGS

FIG. 5 is a diagram to explain a surface modification process.

FIG. 6 is a diagram to explain an organic film deposition process.

FIG. 7 is a diagram presenting a result of analysis using an X-ray photoelectron spectroscopic method.

FIG. 8 is a flowchart of a process in which etching progresses in Example 2.

FIG. 9 is a diagram presenting the thicknesses of an organic film.

DESCRIPTION OF EMBODIMENTS

Respective embodiments of the present invention are described below with reference to the drawings.

In embodiments herein, with a focus placed on differentiation of incubation time involved with a surface modification process, as a technique for completely protecting WFM and HM films in a p-type FET channel formation region with an organic film, not relying on heat treatment and ALD, control is performed of the thickness of the organic film that is formed onto the surface of each of the WFM and HK films which are metal films in an n-type FET channel formation and the organic embedded film in the p-type FET channel formation region. Incubation time is time from start of deposition until a developed seed of deposition expands to critical nucleus size and appears as a film. Also, this time varies depending on surface modification process conditions.

In other words, controlling the incubation time involved with the surface modification process makes it possible to form the organic film selectively onto the organic embedded film. In a processing procedure, an organic film deposition process is performed after the surface modification process, so that control is performed of the thickness of the organic film that is formed onto the surface of each.

In the embodiments herein, a plasma processing method for forming the organic film onto the organic embedded film selectively in contrast to the WFM film and HK films is to control parameters for plasma etching so that the incubation time for the WFM film and HK films will become longer than the incubation time for the organic embedded film and carry out the surface modification process.

In addition, in the plasma processing method for forming the organic film onto the organic embedded film selectively in contrast to the WFM film and HK films, it is preferable to control parameters for plasma etching so that the incubation time for the WFM film and HK films will become longer than the incubation time for the organic embedded film and the organic film will be formed onto the organic embedded film and carry out the surface modification process and the organic film deposition process.

(Example of an Overall Configuration of a Plasma Processing Apparatus)

Figure 1:
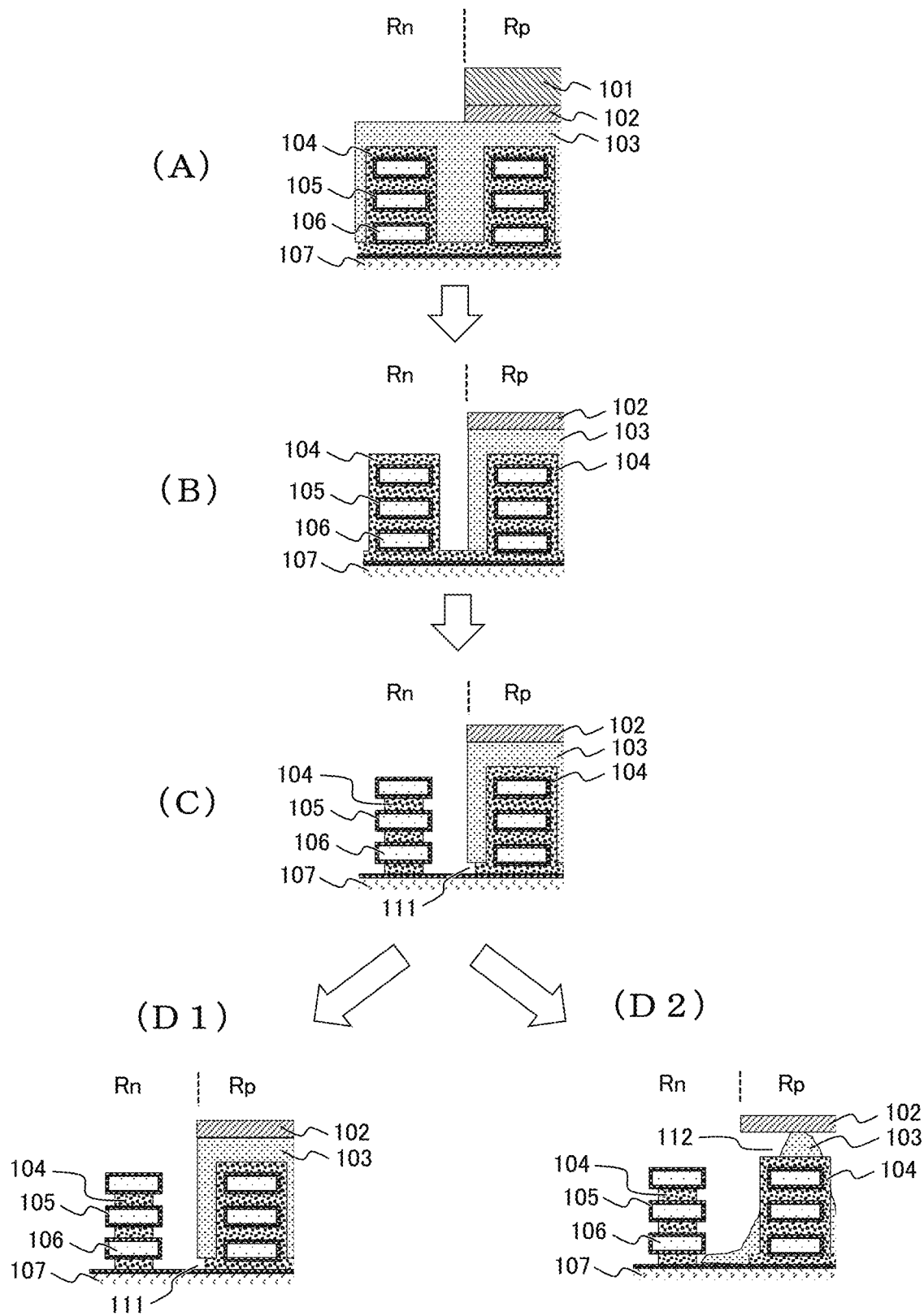
FIG. 1 is a diagram depicting a first method of PTL 1.
Figure 2:
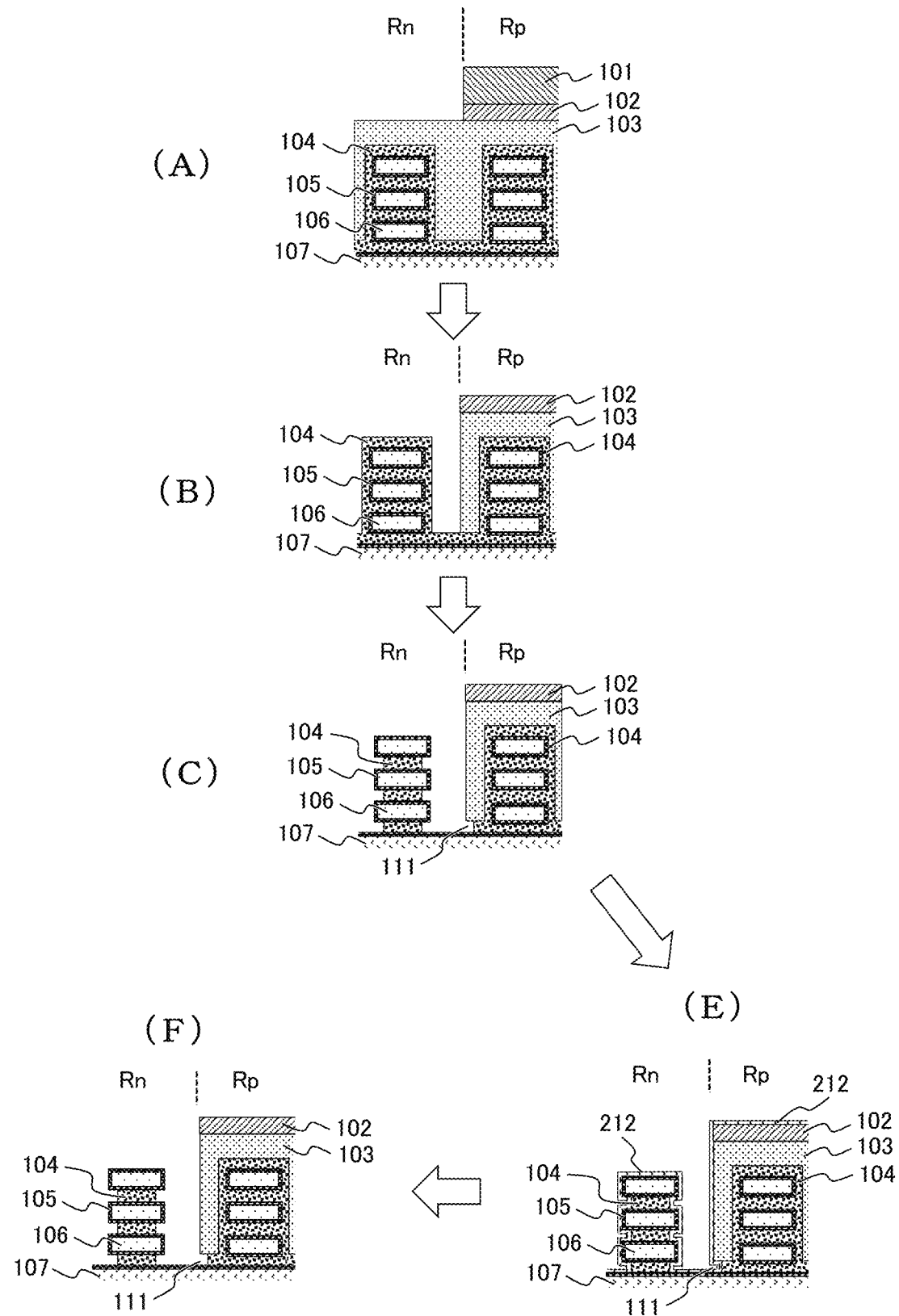
FIG. 2 is a diagram depicting a second method of PTL 1.
Figure 3:
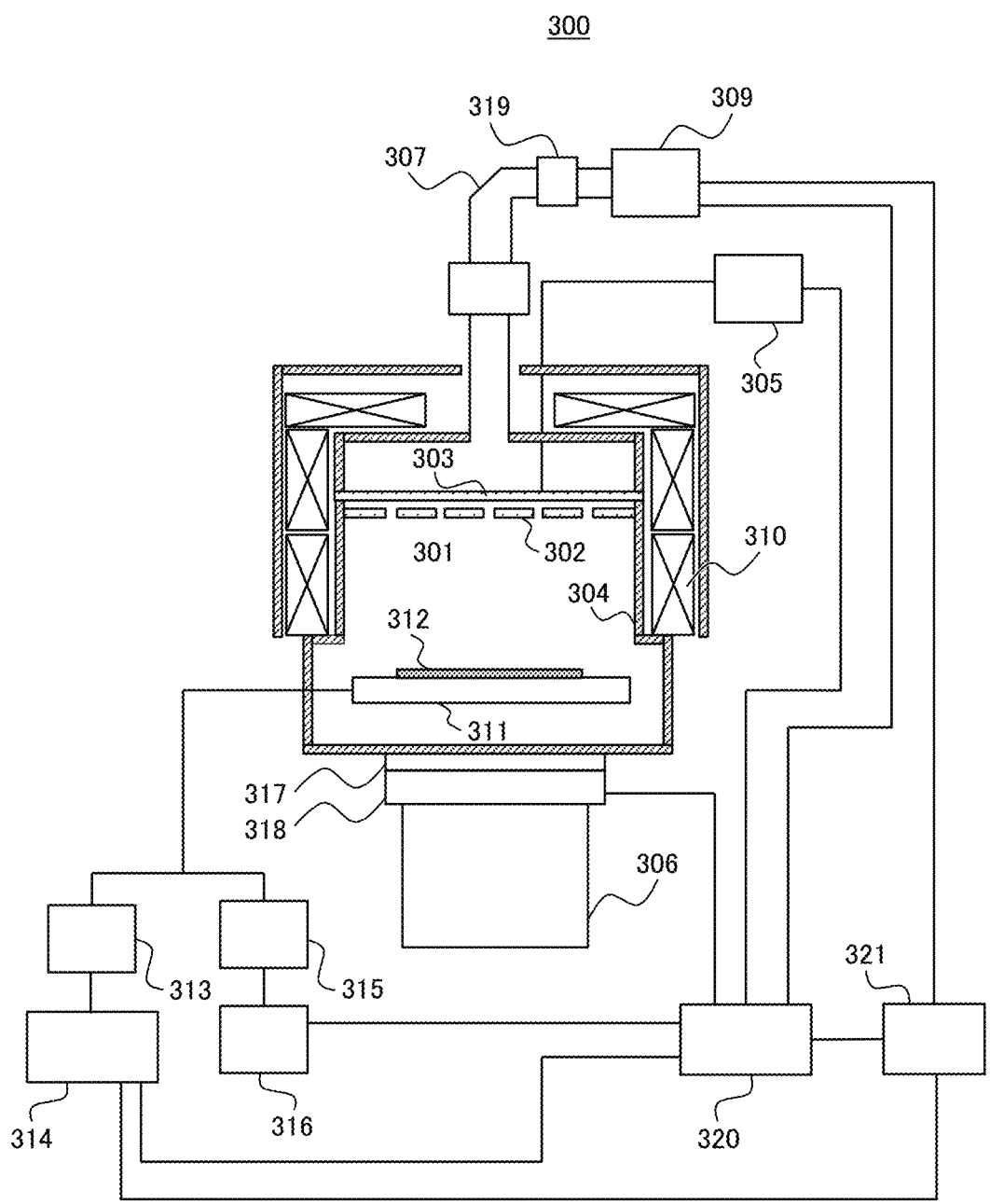
FIG. 3 is a diagram depicting a configuration of a microwave plasma etching apparatus which can be used for the present invention.

FIG. 3 depicts a general cross-sectional diagram a microwave plasma etching apparatus based on an ECR (Electron Cyclotron Resonance) method (hereinafter also referred to as a "plasma processing apparatus") 300 which can be used for one embodiment of the present invention. In this microwave plasma etching apparatus 300, in an upper part of a vacuum vessel 301 with its top open, a shower plate 302 (made of quarts, for example) for feeding etching gas into the vacuum vessel 301 and a dielectric window 303 (made of quarts, for example) are placed to seal the vacuum vessel 301, thus forming a processing chamber 304 which is a plasma processing chamber. A gas supply device 305 for supplying a flow of etching gas is connected to the shower plate 302.

Also, a vacuum exhaust device 306 is connected to the vacuum vessel 301 through an exhaust flow opening/closing valve 317 and an exhaust speed varying valve 318. The interior space of the processing chamber 304 is depressurized by opening the exhaust flow opening/closing valve 317 and driving the vacuum exhaust device 306 and is placed in a vacuum state depressurized from atmospheric pressure. Pressure inside the processing chamber 304 is adjusted to a desired pressure by the exhaust speed varying valve 318.

Etching gas is fed into the processing chamber 304 from the gas supply device 305 via the shower plate 302 and exhausted by the vacuum exhaust device 306 via the exhaust speed varying valve 318.

Also, in a lower part of the vacuum vessel 301, a sample mounting electrode 311 which is a sample stage is provided to face the shower plate 302. A waveguide 307 that transmits electromagnetic waves is provided above the dielectric window 303 to supply radio frequency power for generating plasma to the processing chamber 304. Electromagnetic waves that are transmitted to the waveguide 307 are oscillated from an electromagnetic wave generating power supply 309 which is a microwave power supply via a matching device 319. A pulse generating unit 321 is installed to the electromagnetic wave generating power supply 309 and this enables pulse modulation at a repetition frequency, allowing microwaves to be set optionally. Although there is no particular restriction on electromagnetic wave frequency, microwaves of 2.45 GHz are used in embodiments herein.

A magnetic field generating coil 310 to generate a magnetic field is provided in the outside periphery of the processing chamber 304. Electromagnetic waves oscillated from the electromagnetic wave generating power supply 309 generate high density plasma inside the processing chamber 304 by interaction with the magnetic field generated by the magnetic field generating coil 310 and etching is performed of a wafer 312 which is a sample placed on the sample mounting electrode 311 which is the sample stage.

Since the shower plate 302, the sample mounting electrode 311, the magnetic field generating coil 310, the exhaust flow opening/closing valve 317, the exhaust speed varying valve 318, and the wafer 312 are located coaxially with respect to a central axis of the processing chamber 304, the etching gas flow, radicals and ions generated by plasma, and moreover, reaction products generated by etching are supplied and exhausted coaxially with respect to the wafer 312. This coaxial placement produces an effect of making the etching rate and wafer in-plane uniformity of the etching shape approximate to axis symmetry and improving uniformity of wafer processing. The surface of the sample mounting electrode 311 is covered with a thermal sprayed film (not depicted) and a direct current power supply 316 is connected to the sample mounting electrode 311 via a radio frequency filter 315. Furthermore, a radio frequency bias power supply 314 is connected to the sample mounting electrode 311 via a matching circuit 313. The radio frequency bias power supply 314 is connected to the pulse generating unit 321 and time-modulated radio frequency power can be supplied selectively to the sample mounting electrode 311. Although there is no particular restriction on radio frequency bias frequency, 400 kHz is used in embodiments herein, but 800 kHz may be used in some embodiment.

A controller 320 that controls the abovementioned ECR microwave plasma etching apparatus 300 controls the electromagnetic wave generating power supply 309, the radio frequency bias power supply 314, a repetition frequency and duty ratio including turn on/off timing of pulses generated by the pulse generating unit 121, etching parameters such as a gas flow rate, processing pressure, microwave power, radio frequency bias power, coil current, and pulse on time and off time for execution of etching, through input means (not depicted).

The duty ratio is a proportion of an on period to one pulse cycle period. In embodiments herein, the pulse repetition frequency can be modified in a range from 5 Hz to 10 kHz and the duty ratio can be modified in a range from 1% to 90%. In addition, time modulation can be set for both on time and off time. Then, embodiments using the abovementioned microwave plasma etching apparatus 300 are described below.

Example 1

Figure 4:
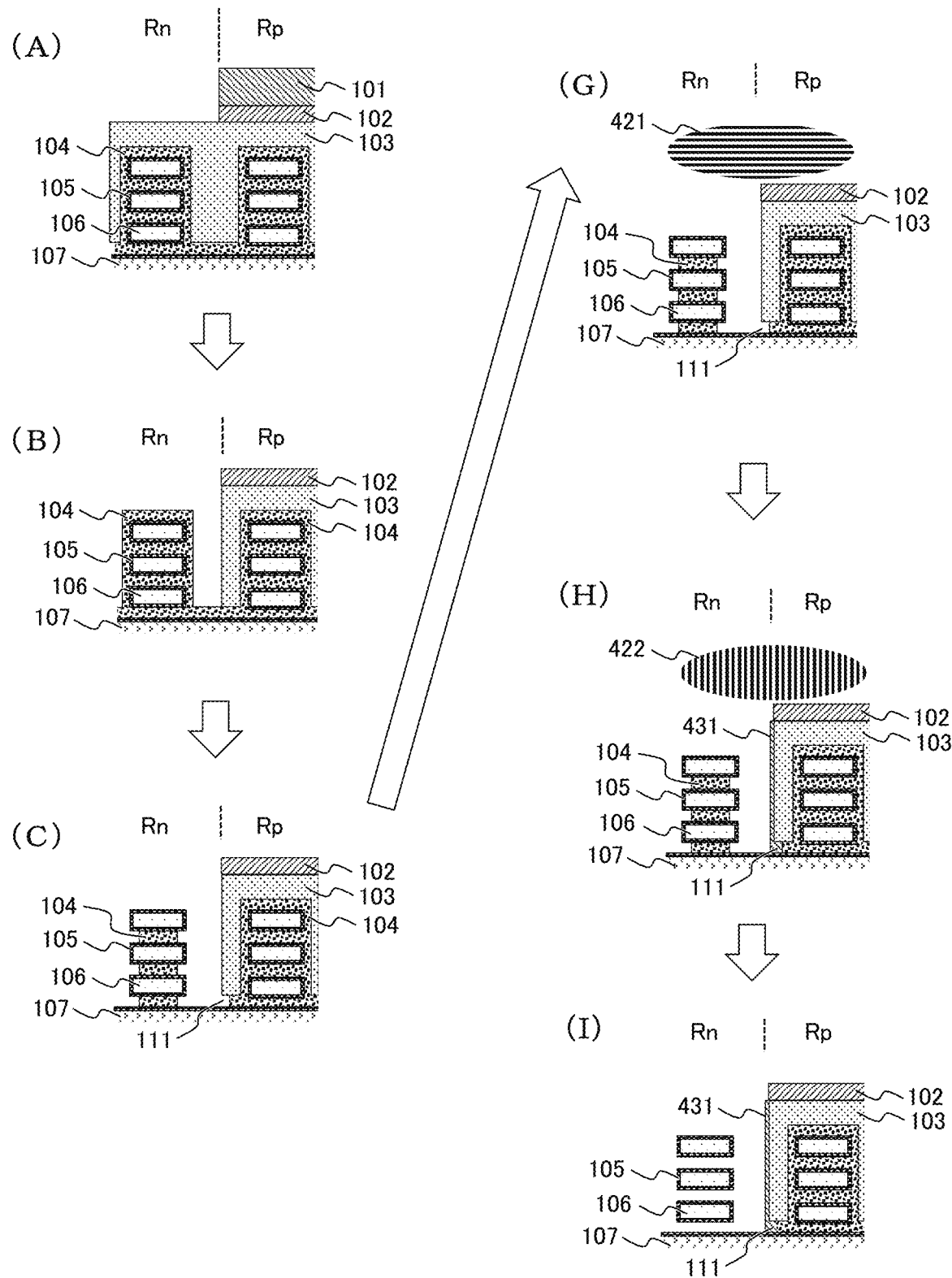
FIG. 4 is a flowchart of a process in which etching progresses in Example 1.

FIG. 4 depicts a process in which etching progresses in Example 1. In FIG. 4, Rn denotes an re-channel FET formation region and Rp denotes a p-channel FET formation region. FIG. 4(A) depicts an etching step to remove a hard mask film 102 in the n-channel FET formation region Rn. FIG. 4(B) depicts an etching step to remove an organic embedded film 103 in the n-channel FET formation region Rn. FIG. 4(C) depicts an underetching step of a WFM film 104 in the n-channel FET formation region Rn and, by this step, the WFM film 104 on the bottom surface between the channels in the n-channel FET formation region Rn and the p-channel FET formation region Rp is removed. Therefore, FIG. 4(C) can be said as the step of removing the WFM film 104 on the bottom surface between the channels in the n-channel FET formation region Rn and the p-channel FET formation region Rp. FIG. 4(G) denotes a surface modification processing step and FIG. 4(H) denotes an organic film deposition processing step. By the surface modification processing step and the organic film deposition processing step, a protective film 431 is formed selectively onto the organic embedded film 103 in the p-type channel formation region Rp. Therefore, the surface modification processing step and the organic film deposition processing step can be said as the steps of forming the protective film 431 onto the organic film 103 in the p-type channel formation region Rp. The surface modification processing step can be said as a first step and the organic film deposition processing step can be said as a second step to be executed following the first step. FIG. 4(I) denotes a step of removing the WFM films 104 in the n-type channel formation region Rn. The etching process in FIG. 4 proceeds in an arrow direction marked in FIG. 4, (A)→(B)→(C)→(G)→(H)→(I).

A cross-sectional structure of a semiconductor device as a sample depicted in FIG. 4(A) is now briefly described. The cross-sectional structure of the semiconductor device is the structure of a gate part of a gate all around (GAA: Gate All Around) type FET; in this part, multiple sheet-shaped channel layers 106 are layered into a laminate and all the peripheries of the channel layers 106 are covered with gate electrodes 105 via an interposed gate insulating film (not depicted). In this figure, the GAA-type FET source region and drain region are not depicted.

The n-channel FET formation region Rn where an re-channel FET is formed and the p-channel FET formation region Rp where a p-channel FET is formed are provided on the surface side of a semiconductor substrate (Si substrate) 107 made of silicon. Over an insulating film like a silicon oxide film formed onto the surface side of the semiconductor substrate 107, a WFM film (work function control metal film) 104 is formed. The semiconductor substrate 107 can also be regarded as a semiconductor wafer.

In the n-channel FET formation region Rn, three silicon films 106 that configure the channel layers (a channel region) of the n-channel FET are vertically disposed and all the peripheries of each of the three silicon films 106 are covered with HK films (low resistance gate metal film) 105. Moreover, all the peripheries of the respective HK films 105 covering all the peripheries of the three silicon films 106 are covered with WFM films 104. A gate insulting film (not depicted) is interposed between each silicon film (Si film) 106 and each HK film 105.

In the p-channel FET formation region Rp, three silicon films (Si films) 106 that configure the channel layers (a channel region) of the n-channel FET are vertically disposed and all the peripheries of each of the three silicon films 106 are covered with HK films (low resistance gate metal films) 105. Moreover, the respective HK films 105 covering all the peripheries of the three silicon films 106 are covered with WFM films 104. A gate insulting film (not depicted) is interposed between each silicon film (Si film) 106 and each HK film 105.

In the n-channel FET formation region Rn and the p-channel FET formation region Rp, an organic embedded film 103 is formed to cover the top and side surfaces of the WFM films 104. A hard mask film 102 is formed selectively to cover the top surface of the organic embedded film 103 in the p-channel FET formation region Rp and a resist mask film 101 is formed selectively to cover the top of the hard mask film 102. Although an $SiO_2$ film is used as the hard mask film 102 in the sample of the present example, a hard mask film of SiN or the like may be used. In addition, while here described is an example in which an organic film named a BARC (BARC: Bottom Anti-Reflective Coat) film is used as the organic embedded film 103, an organic such as an OPL (Organic Planarizing Layer) film or a PMMA (Polymethyl methacrylate) film may be used. Furthermore, while here described is an example in which a TiN film is used as the WFM film (work function control metal film) 104 and an HfO film is used as the HK film (low resistance gate metal film) 105, a suitable metal material may be used according to the type and usage of the FETs.

According to Example 1, etching is first performed of the $SiO_2$ film which is the hard mask film 102 along the resist mask film 101, as depicted in FIG. 4(A). Subsequently, etching is performed of the BARC film 103 which is the organic embedded film in the n-channel FET formation region Rn, as depicted in FIG. 4(B). Subsequently, etching (underetching) is performed of a certain amount of each exposed layer of the TiN film 104 which is the WFM film in the n-channel FET formation region Rn and the TiN film 104 on the bottom surface (bottom) of the n-channel FET formation region Rn and the p-channel FET formation region Rp is removed, as depicted in FIG. 4(C). Thereby, the TiN film 104 is separated into parts across the boundary between the p-channel FET formation region Rp and the n-channel FET formation region Rn and, at the same time, a recessed space 111 is formed at the bottom of the organic embedded film 103 in the p-channel FET formation region Rp.

Then, plasma 421 for surface modification is generated inside the processing chamber 304 of the microwave plasma etching apparatus 300 and a surface modification process (the surface modification process is hereinafter referred to as (G)) is performed for the side surface of the BARC film 103 in the p-channel FET formation region Rp, as depicted in FIG. 4(G). Here, the surface modification process (G) was performed after inputting the settings of surface modification process conditions 51 mentioned below to the microwave plasma etching apparatus 300 of FIG. 3: the flow rate of sulfur hexafluoride $SF_6$ gas (100 sccm), the gas pressure (1.0 Pa), power of the microwave power supply (600 W), power of the radio frequency bias power supply (0 W), and processing time (5 sec.), as is specified in FIG. 5. Sulfur hexafluoride $SF_6$ gas can be said as a fluorine-containing gas, a first gas, or a first process gas. In other words, the surface modification processing step (first step) depicted in FIG. 4(G) can be said as the step of exposing the plasma generated with a fluorine-containing gas to the n-channel FET formation region Rn and the p-channel FET formation region Rp.

While an example in which the $SF_6$ gas is used as the first gas is described in the present example, a gas that contains fluorine and is used as a typical process gas may be used as the first gas, such as nitrogen trifluoride ($NF_3$), trifluoromethane ($CHF_3$), fluoromethane ($CH_3F$), difluoromethane ($CH_2F_2$), or perfluorocyclobutane ($C_4F_8$).

Then, an organic film deposition process (the organic film deposition process is hereinafter referred to as (H)) is performed, as depicted in FIG. 4(H). In the organic film deposition process (H), plasma 422 for organic film deposition is generated inside the processing chamber 304 and an organic film (protective film) 431 is formed onto the side surface of the BARC film 103 and to fill the space 111 in the p-channel FET formation region Rp. Here, the organic film deposition process (H) was performed after inputting the settings of organic film deposition process conditions 61 mentioned below to the microwave plasma etching apparatus of FIG. 3: a mixed gas consisting of nitrogen $N_2$ gas (flow rate: 60 sccm), argon Ar gas (flow rate: 288 sccm), and methane ($CH_4$) gas (flow rate: 12 sccm), gas pressure (3.5 Pa), power of the microwave power supply (1000 W), power of the radio frequency bias power supply (0 W), and processing time (10 sec.), as is specified in FIG. 6. In addition, methane ($CH_4$) gas may be replaced with a gas that contains carbon and hydrogen, such as ethane ($C_2H_6$) gas, propane ($C_3H_8$) gas, butane ($C_4H_{10}$), methyl chloride ($CH_3Cl$) gas, methylene chloride ($CH_2Cl_2$) gas, or methanol ($CH_3OH$) gas and the methane ($CH_4$) gas can be said as a second process gas. In other words, the organic film deposition processing step (second step) depicted in FIG. 4(H) can be said as the step of exposing the plasma generated with a gas that contains carbon and hydrogen to the n-channel FET formation region Rn and the p-channel FET formation region Rp after the surface modification processing step (first step) is performed. In addition, the processing time (5 sec.) of the surface modification processing step (first step) is set shorter than the processing time (10 sec.) of the organic film deposition processing step (second step).

Then, a step of removing the WFM films 104 in the n-type channel formation region Rn is performed, as depicted in FIG. 4(I).

By this organic film deposition process (H), the organic film 431 is formed onto the side surface of the BARC film 103 and inside the recessed space 111 at the bottom in the p-channel FET formation region Rp. In this process, the organic film 431 is not formed onto the surfaces of the TiN film 104 and HfO films 105 in the re-channel FET formation region Rn. In this way, by performing the organic film deposition process (H) after the surface modification process (G), it becomes possible to form the organic film 431 selectively onto the BARC film 103 in the p-channel FET formation region Rp and not to form the organic film 431 onto the WFM film 104 and HK films 105 in the n-channel FET formation region Rn. In addition, cleaving the sample and observing and making length measurement of a cross section of the organic film 431 by SEM (Scanning Electron Microscope) revealed that thickness of the organic film 431 is on the order of 5 nm.

Then, in order to investigate a mechanism that enables it to form the organic film 431 selectively onto the BARC film 103 according to the present example, an analysis was made of the BARC film 103 surface, the TiN film 104 surface, and the HfO film 105 surface before and after the surface modification process (G) in the present example, using an X-ray photoelectron spectroscopic method (X-Ray Photoelectron Spectroscopy: hereinafter referred to as XPS). FIG. 7 presents a result of element ratio analysis of the surfaces of the BARC film 103, TiN film 104, and HfO film 150. In FIG. 7, a reference numeral 71 denotes the element ratio (%) in the BARC film 103 surface; 72 denotes the element ratio (%) in the Hfo film 105 surface; and 73 denotes the element ratio (%) in the TiN film 104 surface.

As presented in FIG. 7, as a characteristic after the surface modification process (G), it was found that the percentage of fluorine (F) increased in the surface of each film surface. Specifically, before and after the surface modification process (G), the percentage of fluorine (F) changes from 0.9% to 30.7% in the surface of the BARC film 103, changes from 2.4% to 22.0% in the surface of the Hfo film 105, and changes from 0.6% to 7.9% in the surface of the TiN film 104.

This infers that, inter alia, CFx exists in the surface of the BARC film 103, TiFx exists in the surface of the TiN film 104, and HfFx exists in the surface of the HfO film 105 in a fluorinated state. A mechanism that can be thought from this result is described below. The surface modification process (G) puts the surface of each film in the fluorinated state and C (carbon) or CH (methyl) is supplied during the organic film deposition process (H) that follows. Because the principal component of the BARC film 103 itself is C (carbon), F (fluorine) augmented by the surface modification process (G) bonds strongly with C (carbon) in the organic film deposition process (H) and resulting CF (carbon fluoride) is considered to become deposited or adsorb onto the surface of the BARC film 103. On the other hand, in the surfaces of the TiN film 104 and HfO films 105, resulting HfFx (hafnium fluoride) of TiFx (titanium fluoride) considered to be eliminated or volatilized.

This mechanism can also be explained from the fact that deposition of the organic film 431 onto the surfaces of the TiN film 104 and HfO films was not observed during the processing time of 5 seconds of the organic film deposition process (H), whereas deposition of the organic film 431 was observed with the processing time of the organic film deposition process (H) being set to 10 seconds. It is inferred that, during a period from 5 seconds to 10 seconds of the processing time of the organic film deposition process (H), once F (fluorine) has ceased to exist by elimination or volatilization in the surfaces of the TiN film 104 and HfO films 105, the organic film 431 has become deposited by a sudden turn. This is also considered true for the incubation time control mechanism described previously.

In the present example, with a focus placed on differentiation of incubation time involved with the surface modification process (G), as a technique for completely protecting the WFM film 104 and HM film 105 in the p-type FET channel formation region with the organic film 431, not relying on heat treatment and ALD, control is performed of the thickness of the organic film 431 that is formed onto the surface of each of the BARC film 103, WFM film 104, and HK films 105. Here, incubation time is time from start of deposition until a developed seed of deposition expands to critical nucleus size and appears as a film. Also, this time varies depending on surface modification process conditions (see 51).

In other words, controlling incubation time involved with the surface modification process makes it possible to form the organic film 431 selectively onto (the surface of) the organic embedded film 103. In the processing procedure, the organic film deposition process (H) is performed after the surface modification process (G), so that control is performed of the thickness of the organic film 431 that is formed onto the surface of each of the BARC film 103, WFM film 104, and HK films 105.

In the present example, a plasma processing method for forming the organic film 431 onto the organic embedded film 103 selectively in contrast to the WFM film 104 and HK films 105 is to control parameters for plasma etching (51) so that the incubation time for depositing the organic film 431 onto the WFM film 104 and HK films 105 will become longer than the incubation time for depositing the organic film 431 onto the organic embedded film 103 and carry out the surface modification process (G).

In addition, in the plasma processing method for forming the organic film 431 onto the organic embedded film 103 selectively in contrast to the WFM film 104 and film HK 105, it is preferable to control parameters for plasma etching (51, 61) so that the incubation time for depositing the organic film 431 onto the WFM film 104 and HK films 105 will become longer than the incubation time for depositing the organic film 431 onto the organic embedded film 103 and the organic film 431 will be formed onto the organic embedded film 103 and carry out the surface modification process (G) and the organic film deposition process (H).

Example 2

FIG. 8 presents a flowchart of a process in which etching progresses in Example 2. FIG. 9 presents the thicknesses of the organic film when the flow of FIG. 8 has been performed. In the case of Example 1, after carrying out the surface modification process (G) and the organic film deposition process (H) for a sample, the sample was cleaved and a cross section of the formed organic film 431 was observed and measured in length by the SEM. As a result, it was revealed that that thickness of the organic film 431 is on the order of 5 nm. Then, in Example 2, a method for increasing the thickness of the organic film 431 to be formed is described.

As described for FIG. 4 in Example 1, in order to further increase the thickness of the organic film 431 on only the surface of the BARC film 103, the organic film 431 is made not to become deposited onto the surfaces of the TiN film 104 and HfO films 105 by increasing the incubation time not to deplete F (fluorine) and, by increasing the processing time of the organic film deposition process (H) to deposit the organic film 431 onto the surface of the BARC film 103, the thickness of the organic film 431 will increase.

The process of FIG. 8 in which etching progresses in Example 2 is described.

(Step S1: SiO$_2$ Film Etching Step)

Etching is performed of the SiO$_2$ film 102 which is the hard mask film along the resist mask film 101, as depicted in FIG. 4(A).

(Step S2: Organic Embedded Film Etching Step)

Etching is performed of the BARC film 103 which is the organic embedded film in the n-channel FET formation region Rn, as depicted in FIG. 4(B).

(Step S3: WFM Film Underetching Step)

Etching (underetching) is performed of a certain amount of each exposed layer of the TiN film 104 which is the WFM film in the n-channel FET formation region Rn, and the TiN film 104 on the bottom of the n-channel FET formation region Rn and the p-channel FET formation region Rp is removed, as depicted in FIG. 4(C).

(Step S4: Surface Modification Processing Step)

Plasma 421 for surface modification is generated inside the processing chamber 304 of the microwave plasma etching apparatus 300 and a surface modification process is performed for the side surface of the BARC film 103 in the p-channel FET formation region Rp, as depicted in FIG. 4(G). The surface modification process uses surface modification process conditions 51 as presented in FIG. 5.

(Step S5: Organic Film Deposition Processing Step)

An organic film deposition process is performed, as depicted in FIG. 4(H). In the organic film deposition process, plasma 422 for organic film deposition is generated inside the processing chamber 304 and an organic film 431 is formed onto the side surface of the BARC film 103 and to fill the space 111 in the p-channel FET formation region Rp. The organic film deposition process uses organic film deposition process conditions 61 as presented in FIG. 6.

(Multiple Time Repetition)

Then, the step S4 and step S5 are repeatedly carried out multiple times. The number of times of repetitions shall be n times. Here, a value of n is to be set so that the thickness of the organic film 431 will reach a desired value of thickness.

(Step S6: Organic Film Thickness Measuring Step)

Subsequently, measurement is made of the thickness of the organic film 431.

Note that, after verification that the thickness of the organic film 431 has reached a desired value of thickness at the step S6, a step of removing the WFM films 104 in the n-type channel formation region Rn is performed, as depicted in FIG. 4(I), which is, however, not depicted in FIG. 8.

As is presented in FIG. 9, if the number of times of repetitions is once, the thickness of the organic film 431 is, e.g., 5 nm. If the number of times of repetitions is twice, the thickness of the organic film 431 is, e.g., 9 nm. If the number of times of repetitions is three times, the thickness of the organic film 431 is, e.g., 14 nm.

As is presented in FIG. 9, by repeating from the step S4 (the surface modification processing step) to the step S5 (the organic film deposition processing step) multiple times (n times), it is possible to increase the thickness of the organic film 431 deposited onto the surface of the BARC film 103 without increasing the thickness of the organic film 431 deposited onto the surfaces of the TiN film 104 and HfO films 105.

In the present example, the example of application in the microwave plasma etching apparatus based on ECR (Electron Cyclotron Resonance) using microwaves has been described; however, no limitation to this is intended. A plasma etching apparatus using capacitively coupled or inductively coupled plasma generating means may be used.

As described hereinbefore, the plasma processing method for forming the organic film onto the organic embedded film selectively in contrast to the WFM film and HK films makes it possible to form the organic film only onto the organic embedded film selectively by controlling parameters for plasma etching so that the incubation time for the WFM film and HK films will become longer than the incubation time for the organic embedded film and carrying out the surface modification process and the organic film deposition process and, furthermore, the thickness of the organic film that is formed onto the organic embedded film will increase by repeating the surface modification process and the organic film deposition process multiple times.

While the invention made by the present inventors has been described specifically based on its examples hereinbefore, it will be appreciated that the present invention is not limited to the foregoing examples and various modifications may be made thereto without departing from the gist of the present invention. For example, the foregoing examples are those described in detail to explain the present invention to make it easy to understand and the present invention is not necessarily limited to those including all components described. In addition, for a subset of the components of each example, other components may be added to the subset or the subset may be removed or replaced by other components.

REFERENCE SIGNS LIST

101 . . . resist mask film
102 . . . hard mask film
103 . . . organic embedded film (organic film)
104 . . . WFM film (work function control metal film)
105 . . . HK film (low resistance gate metal film)
106 . . . Si film (channel layer)
107 . . . Si substrate
111 . . . recessed space
421 . . . plasma for surface modification
422 . . . plasma for organic film deposition
431 . . . organic film (protective film)

The invention claimed is:

1. A semiconductor device manufacturing method for manufacturing a semiconductor device including Gate All Around type Field effect transistors, the method comprising:
a step of removing an organic film on an n-type channel;
a step of removing a work function control metal film on a bottom surface between channels;
a step of forming a protective film onto an organic film on a p-type channel in a fluorinated state; and
a step of removing a work function control metal film on the n-type channel.

2. The semiconductor device manufacturing method according to claim 1, wherein a surface of the organic film of the p-type channel in the fluorinated state has an element ratio of fluorine of at least 30%.

3. The plasma processing method according to claim 1, wherein the step of forming the protective film includes a first step of exposing plasma generated with a fluorine-containing gas to the n-type channel and the p-type channel.

4. The plasma processing method according to claim 3, wherein the step of forming the protective film includes a second step of exposing plasma generated with a gas that contains carbon and hydrogen to the n-type channel and the p-type channel, following the first step.

5. The plasma processing method according to claim 4 wherein the first step processing time is shorter than the second step processing time.

6. The plasma processing method according to claim 4, wherein the gas that contains carbon and hydrogen is methane gas.

7. The plasma processing method according to claim 3, wherein the fluorine-containing gas is $SF_6$ gas, $NF_3$ gas, $CHF_3$ gas, $CH_3F$ gas, $CH_2F_2$ gas, or $C_4F_8$ gas.

8. The plasma processing method according to claim 4, wherein plasma in the second step is generated with a mixed gas of methane gas, nitrogen gas, and argon gas.

9. A plasma processing method for forming Gate All Around type Field effect transistors, the method comprising:
a step of removing an organic film on an n-type channel;
a step of removing a work function control metal film on a bottom surface between channels;
a step of forming a protective film onto an organic film on a p-type channel; and
a step of removing a work function control metal film on the n-type channel,
wherein the step of forming the protective film includes a first step of exposing plasma generated with a fluorine-containing gas to the n-type channel and the p-type channel.

10. The plasma processing method according to claim 9, wherein the step of forming the protective film includes a second step of exposing plasma generated with a gas that contains carbon and hydrogen to the n-type channel and the p-type channel, following the first step.

11. The plasma processing method according to claim 10, wherein the first step processing time is shorter than the second step processing time.

12. The plasma processing method according to claim 10, wherein the gas that contains carbon and hydrogen is methane gas.

13. The plasma processing method according to claim 10, wherein plasma in the second step is generated with a mixed gas of methane gas, nitrogen gas, and argon gas.

14. The plasma processing method according to claim 9, wherein the fluorine-containing gas is $SF_6$ gas, $NF_3$ gas, $CHF_3$ gas, $CH_3F$ gas, $CH_2F_2$ gas, or $C_4F_8$ gas.

* * * * *